(12) United States Patent
Uhlemann et al.

(10) Patent No.: US 6,995,378 B2
(45) Date of Patent: Feb. 7, 2006

(54) LENS ARRAY WITH A LATERALLY MOVABLE OPTICAL AXIS FOR CORPUSCULAR RAYS

(75) Inventors: Stephan Uhlemann, Heidelberg (DE); Maximilan Haider, Gaiberg (DE); Heiko Müller, Heidelberg (DE)

(73) Assignee: CEOS Corrected Electron Optical Systems GmbH, Heidelberg (DE)

( * ) Notice: Subject to any disclaimer, the term of this patent is extended or adjusted under 35 U.S.C. 154(b) by 38 days.

(21) Appl. No.: 10/499,165

(22) PCT Filed: Nov. 26, 2002

(86) PCT No.: PCT/DE02/04327

§ 371 (c)(1),
(2), (4) Date: Jun. 14, 2004

(87) PCT Pub. No.: WO03/052790

PCT Pub. Date: Jun. 26, 2003

(65) Prior Publication Data

US 2005/0035299 A1    Feb. 17, 2005

(30) Foreign Application Priority Data

Dec. 14, 2001  (DE) ............................... 101 61 680

(51) Int. Cl.
*H01J 37/145*   (2006.01)
*H01J 37/153*   (2006.01)

(52) U.S. Cl. .................... 250/396 R; 250/396 ML; 250/306; 250/310; 250/311

(58) Field of Classification Search .................... None
See application file for complete search history.

(56) References Cited

U.S. PATENT DOCUMENTS 5,952,667 A * 9/1999 Shimizu .................. 250/492.2

(Continued)

*Primary Examiner*—Nikita Wells
(74) *Attorney, Agent, or Firm*—Edwin D. Schindler

(57) ABSTRACT

Disclosed is a lens array having a laterally movable axis for corpuscular rays, particularly for transmission from areas of an object surface onto the focal plane by means of electrons. The inventive array consists of a combined lens comprising a cylinder lens and a quadrupole lens provided with slit diaphragms which can be impinged upon by electric and/or magnetic fields. The optical axis of the quadrupole lens is oriented parallel to the axis of the cylinder lens and defines the optical axis of the projection, the position of which can be altered in relation to the axis of the cylinder lens. The quadrupole lens is in focus in the sector in which the cylinder lens is not in focus and is out of focus in the section in which the cylinder lens is in focus. The inventive combined lens can be operated as an immersion lens for projecting secondary electrons. The immersion field consists of at least two adjacent axially aligned fields. The first field lies between the object and the first slit diaphragm, and the second field lies between the first slit diaphragm and the second slit diaphragm. Both fields can be focused independently from each other. The potential difference between the object and the first diaphragm is comparatively small in relation to the potential difference between the first diaphragm and the second diaphragm, and the potential course between the object and the first diaphragm has to be approximately linear. The combined lens is brought into/out of focus by superposing the immersion field, the cylinder lens field, and the quadrupole field. Alternatively, the lens array can be used as a cathode lens for a photocathode with several homogenous adjacent emission areas.

20 Claims, 2 Drawing Sheets

Figure 1:
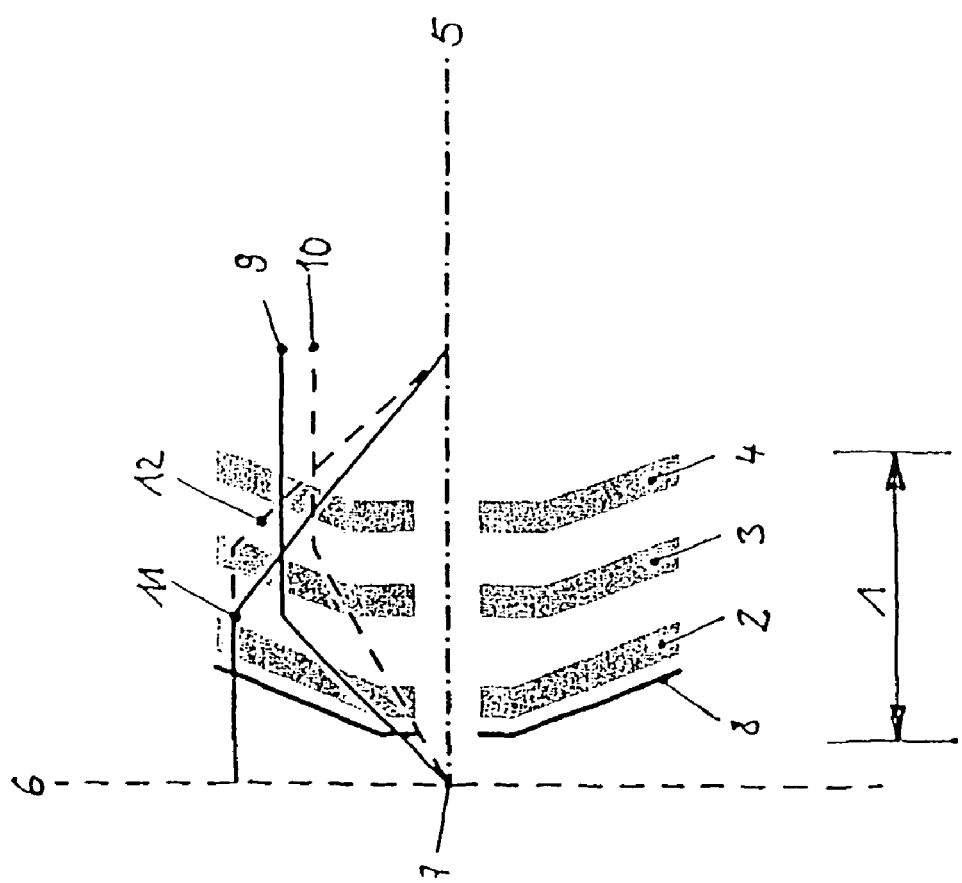

U.S. PATENT DOCUMENTS 6,903,337 B2 * 6/2005 Kienzle et al. ............. 250/306

2004/0084621 A1 * 5/2004 Kienzie et al. ............. 250/310

* cited by examiner

LENS ARRAY WITH A LATERALLY MOVABLE OPTICAL AXIS FOR CORPUSCULAR RAYS

BACKGROUND OF THE INVENTION

1. Field of the Invention

The invention relates to a lens arrangement comprising a laterally displaceable optical axis for particle beams, in particular for transmitting regions of an object plane into the image plane by means of electrons, comprising a combined lens, which consists of a cylinder lens and a quadrupole lens, which has slit diaphragms which can be acted on by electrical and/or magnetic fields, the optical axis of the quadrupole lens extending in the centre plane of the cylinder lens, and defining the optical axis of the image, the position of the optical axis of the quadrupole lens being variable in the direction of the slit-shaped aperture of the cylinder lens, the focusing of the quadrupole lens taking place in the section in which the cylinder lens is unfocused, and the defocusing of the quadrupole lens taking place in the section in which the cylinder lens is focused.

2. Description of the Prior Art

In the production of microscopically fine structures, such as the production of semiconductor devices or integrated circuits, it is necessary to permanently monitor the production process as regards the occurrence of process defects. The aim of this monitoring is the early recognition of defects in the surface structure of the manufactured products and, if appropriate, to take appropriate countermeasures. For monitoring, according to the prior art, microscopy methods are employed, by means of which the surface structure is imaged and optically monitored. Light-optical and electron-optical methods are customarily used, the latter method providing the advantage of substantially higher resolution by virtue of the substantially smaller wavelength of the electrons. This means that the distance between closely adjacent points of an object can assume smaller values in the electron-optical method before the two points in the image plane of the imaging arrangement can no longer be separated as individual points.

In the monitoring of the surface structure, methods are preferred which allow both detection of defects and, when defects are recognised, detailed investigation. In the first of these cases, attention is particularly directed towards a high throughput matched to the production rate in order to allow analyses during production. The electron-optical system must correspondingly allow imaging of a largest possible object field with moderate resolution capacity. In the second case, on the other hand, an image with high optical resolution and good contrast is in particular required.

According to the prior art, low-voltage electron emission microscopes with rotationally symmetrical immersion objectives are used for detailed investigation of the aforementioned surface structures. Here, the specimen to be investigated is illuminated within an object field with low-energy electrons. The secondary electrons released in this process are filtered from the surface of the object by means of an immersion objective and imaged with comparatively high resolution in the image plane. It is customary to use energy filters here to restrict the imaging to electrons from the low-energy portion of the secondary electron spectrum in the range from 1 to 2 eV. In this range, the electron yield is high and the energy window can thus be chosen so narrow that imaging with high resolution is permitted with an adequate aperture angle.

With known microscopes of the aforementioned kind, however, it is regarded as disadvantageous that the image is restricted to a very small object field of typically about 100 $\mu$m diameter in the direct vicinity of the optical axis. This leads to the effect that objects of large extent, such as the wafer regions with a dimension of approx. 25 mm×25 mm used in the production of integrated circuits, must be scanned in two spatial dimensions if their entire surface is to be imaged. Conventional systems are therefore equipped with a slit for receiving the workpiece, which is displaceable perpendicular to the optical axis in two coordinate directions. The two-dimensionally traversable slide with the required high precision, however, is firstly very complicated to construct, and correspondingly expensive to manufacture. Secondly, by virtue of the comparatively low traverse rate, it limits the efficiency of the apparatus.

The prior art also includes electron-optical systems in which elements with non-circular fields are used.

A device of this kind is disclosed in DE 196 34 456.5 (=Spehr/Kerkhoff). It has an electrostatic cylinder lens and a magnetic quadrupole, which, in combination, form images stigmatically like a circular lens. On the quadrupole can be superimposed a magnetic dipole field, which allows a displacement of the optical axis of the image in the direction of longitudinal stretching of the cylinder lens gap.

The second device of the aforementioned type is disclosed in DE 196 44 857.4 (=Rose/Schmidt). It includes an electrostatic cylinder lens comprising at least three electrodes, of which the centre electrode in the longitudinal direction of the slit-shaped electrode aperture consists of segments insulated electrically from one another (comb electrodes). By virtue of this construction, different potentials can be applied to the individual segments of the centre electrode. In this device, the potential distribution is chosen such that an electrostatic quadrupole is generated, whose axis can be displaced in the direction of the gap.

Both of the aforementioned devices are conceived as electron-optical individual lenses and are used as probe-forming arrangements in shaped-beam exposure systems. These systems are less suited for imaging secondary electrons released in an object plane.

Finally, DE 101 36 190.4 discloses a system in which two non-circular systems of the aforementioned type are used. The system permits the error-free projection of, in each case, comparatively large regions of a transmission mask located in the object plane onto a wafer located in the image plane. Here, the optical axis of the quadrupoles, and thus the optical axis of the image is displaced by means of electrical or magnetic fields over the full width of the wafer region, the projection system maintaining its imaging properties. Correspondingly, with this system for describing the entire wafer region only a mechanical displacement of the object in one coordinate direction is required.

The above-described system is only suitable for projection of masks. However, its disadvantage consists in the fact that it is unsuitable for secondary electron imaging and only permits a comparatively low enlargement. Furthermore, for the aforementioned system, it is essential to the invention that two lens systems are used. The entire system is therefore comparatively complicated and correspondingly expensive to manufacture.

SUMMARY OF THE INVENTION

Against this background the object of the present invention is to provide a lens system in which the particles, in particular electrons, emitted from points of an object region are imaged in a physical sense in assigned points on the image plane; the object field comprised by the image has a comparatively large diameter and is displaceable without mechanical positioning steps over a comparatively large width of the object. In the process, the proposed system, when used for monitoring wafer production, permits both detection of defects in the surface structure and a detailed investigation if defects are found.

This object is achieved according to the invention in that
the combined lens is operated as an immersion lens
the immersion field in the axial direction consists of at least two successive fields,
the first field lying between the object and the first slit diaphragm
the second field lying between the first and second slit diaphragm, or a downstream diaphragm pair,
both fields being adjustable independently of one another,
and the focusing/defocusing effect of the combined lens resulting from the superimposition of the immersion field, of the cylinder lens field and of the quadrupole field, The lens arrangement according to the present invention is based on a known combined lens, which is described in the prior art and comprises an electrostatic cylinder lens and a magnetic or electrostatic quadrupole lens. The optical axis of the quadrupole lens here in embodied so as to be displaceably parallel to itself. The means for displacing the optical axis comprise, depending on how the quadrupole is designed, electrostatic or magnetic fields.

With the present invention, however, this lens is embodied as an immersion lens, in particular as an immersion objective. Correspondingly, an immersion field acts on the lens, which in the present invention consists of at least two fields which are adjacent to one another in the axial direction. Of these, the first field lies between the object and first slit diaphragm, the second field lies between the first and second slit diaphragms. This design provides independent adjustment of the intensity of both fields. The focusing of the lens arrangement as an entirety is here determined by the interaction of the immersion field, the cylinder lens field and the quadrupole field.

Immersion slit lenses have the disadvantage per se that the refractive effect of the immersion field can only act in one section because of the slit-shaped design of the lens. If no countermeasures are taken, this property leads to a very different behaviour of the paraxial fundamental paths in both main sections. The consequence of this a very strong astigmatic imaging in the region of the immersion field, which can only be corrected with great difficulty by means of very intense quadrupole lenses.

A central idea of the invention thus consists in the fact that greatly differing optical conditions in the two main sections are to be prevented in advance by means of an adapted potential profile in the region between the object surface and objective lens. It is preferred to embody the immersion lens such that the potential difference between the object surface and first slit diaphragm is comparatively small. A substantial prerequisite for this is the splitting of the immersion field into at least two fields adjacent to one another in the axial direction.

The proposed design leads to a moderate astigmatic splitting in both main sections of the lens, so that stigmatic imaging is possible by means of the focusing/defocusing effect of the quadrupole belonging to the combined lens without the use of further (stronger) quadrupole fields. The quadrupole lens is oriented such that focusing occurs in the section in which the cylinder lens is not focused, and the defocusing in the section in which the cylinder lens is focused.

DETAILED DESCRIPTION OF THE PREFERRED EMBODIMENTS

The variable position of the optical axis of the quadrupole fields relative to the axis of the cylinder lens permits a displacement of the optical axis of the image, the maximum displacement being of the order of centimetres. The region imaged in a region with uniform optical quality around the optical axis can therefore be displaced beyond the object by relatively large distances. In the case of inspection of a wafer during manufacture, therefore, a dimension of the wafer region can be traversed by purely electron-optical means, without mechanical displacement of the object being necessary. Only for scanning the second dimension does the object need to be mounted so as to be mechanically displaceable. Compared with processes with conventional low-voltage electron microscopes with rotationally symmetrical immersion objective lenses, which require a two-dimensional mechanical scanning of the wafer, the application of the immersion lens according to the present invention provides a considerable time saving, and opens up the possibility of a significantly shorter duration for the inspections during production. The inspections to be carried out then no longer limit the throughput of the production system. Here, the proposed system by virtue of its construction principle permits both a detection of defects in the surface structure and detailed investigation in the event of defects being recognised. Typical system data on operation in detection mode are a resolution of 50 nm and an imaged object field with an edge length of about 100 $\mu$m, while, for operation in the detailed investigation mode, a resolution of 10 nm can be achieved.

In a preferred further development of the invention, the thickness of the first slit diaphragm of the combined lens is significantly larger than that of the downstream slit diaphragms. This constructional measure has the effect that only a slight penetration of the immersion field emerges between the first and second diaphragm towards the object. This field can correspondingly be chosen large without negative consequences for the size of the occurring astigmatism. For just this reason, on the other hand—as already stated—the field lying between the diaphragm and object is made relatively small, which is made possible by a splitting of the immersion field into two independently specifiable fields. Typical values for the potential at the first diaphragm are 1 to 2 kV, and for that on the downstream diaphragm of the order of 10 to 20 kV.

The average potential on the first slit diaphragm in addition determines the field intensity at the location of the object. A comparatively low potential at the first diaphragm therefore advantageously leads to a low loading of the object by the immersion field. Typical values for the electrical field at the location of the wafer are 500 to 1000 V/mm. For the application of the lens arrangement according to the invention for checking the wafer surface, this property of the present system takes on a special importance, since wafers represent very sensitive objects.

For imaging an object region-by-region with the lens arrangement according to the invention, it is of advantage if the change of position of the optical axis of the aforementioned quadrupole lens is carried out continuously and preferably in the direction of the slit of the slit diaphragms.

The advantage of this embodiment lies in the fact that, in this manner, the object can be continuously scanned in the coordinate direction parallel to the slit, the length of the scanned strip taking on the greatest possible value.

To obtain an image of the entire object, it is necessary to embody the object so as to be displaceable in a direction that is perpendicular to the optical axis of the quadrupole lens and perpendicular to the direction of the diaphragm slit in the cylinder lens. According to one feature of the invention, in the present lens arrangement, such means are provided. The image of the entire object is then carried out such that a strip of the object, for example of the length of the diaphragm slit and in the width of the transmitted object field, is scanned by electron-optical means, after scanning the optical axis of the arrangement is set back to the original edge of the object and a strip on the object, which is displaced by a strip width, is scanned anew in the direction of the diaphragm slit.

To ensure that each new strip is contiguous with the preceding strip without a gap, it is necessary to match the feed rate and scanning rate to one another. If the speed of the object perpendicular to the direction of the diaphragm slit is designated $v_1$, the scanning speed of the optical axis in the object plane of the lens arrangement is designated $v_2$, then, for the ratio of the velocities, the relationship $$V_1/v_2 \text{ approximately equals } d/b,$$

applies, where d is the diameter of the imageable object field and b is the width of the object transverse to its displacement direction.

According to another feature of the invention, it is provided that the size of the immersion field and/or of the cylinder lens field and/or of the quadrupole field can in each case be differently specified in dependence on the position of the axis of the quadrupole. The background to this embodiment is that the image aberration of the arrangement increases with increasing deflection of the imaging optical axis from the geometrical centre of the arrangement, and therefore the optical resolution is all the smaller the further the axis of the quadrupole is displaced from the slit centre towards the edge of the slit. The occurrence of image aberrations can, however, be effectively countered by means of a displacement with accompanying change of the excitation of the lens arrangement. In the imaging of non-centralized object fields, a displacement-dependent strategy of image aberration correction is therefore necessary, which is ensured by the proposed embodiment of the fields.

In the technical implementation of the required fields in electron-optical lenses, a plurality of possibilities is in principle available. According to the present invention, it is provided to embody the aforementioned cylinder lens as an electrostatic lens and the aforementioned quadrupole lens optionally by means of an electrostatic or magnetic lens.

In the variant of the lens arrangement with magnetic quadrupoles, it is of advantage if the quadrupole field can be generated by a rectangular aperture in a material of high magnetic permeability, on the edges of which current-carrying conductors extend parallel to the optical axis of the cylinder lens. In this case, the current flux in the conductors is directed parallel to opposite edges of the opening and counter to the edges lying perpendicular thereto. A simple technical solution for this arrangement provides for the conductors to be formed by a coil wound on a yoke, which is mounted in the interior of a slit-shaped opening, the conductors being oriented parallel to the optical axis.

In the case of the aforementioned quadrupole, the displacement of the optical axis can be advantageously achieved by superimposing a magnetic dipole. A dipole field parallel to the longitudinal axis of the slit in the slit diaphragms of the cylinder lens here effects a displacement of the optical axis of the quadrupole in just this direction. The dipole is technically most easily produced by means of two yokes of magnetically permeable material, which are in each case wound with a coil. Generation of the dipole field by means of electrical currents here permits a continuous displacement of the dipole by appropriate specification of the excitation current.

In the second variant of the lens arrangements with electrostatic quadrupoles, it is provided that the combined lens has at least three slit diaphragms, at least one of which in the longitudinal direction of the slit consists of segments electrically insulated from one another (comb diaphragm), and different electrical potentials can be applied to the segments.

By means of appropriate potentials on the individual segments of the slit diaphragm, it is possible to generate multipole fields, as well as to implement fields migrating with respect to time over the comb diaphragm. Of particular interest here, according to a feature of the invention, is the application to the segments of potentials that lead to the occurrence of a quadrupole field.

The magnetic or electrostatic quadrupole lens of the two variant embodiments, together with the cylinder lens, have to a first approximation the imaging properties of a circular lens when the quadrupole field is oriented such that the focusing takes place in the section in which the cylinder lens is not focused, and the defocusing takes place in the section in which the cylinder lens is focused. Because of a suitable specification of the fields, stigmatic images can thereby be obtained with the present lens arrangement.

According to a he further embodiment of the invention, the potentials on the individual segments can be formed so as to be time dependent; they therefore migrate successively from one segment to the next. By this means—as with the magnetic quadrupole by means of the variable dipole—a displacement of the quadrupole field and of the image optical axis associated with the axis of said quadrupole field can be achieved over the length of the slit in the slit diaphragms. By virtue of the displaceable optical axis, the proposed lens arrangements have the advantage over circular lenses that even object regions lying wide apart are accessible for imaging.

According to a feature of the invention, it is proposed that the present lens arrangement is used in semiconductor lithography for inspection of the surface structure in the production of wafers. The use of the lens arrangement according to the invention in this area has be adequately illustrated in the above-described embodiment of the invention.

The present invention however also comprises the use of the proposed lens arrangement as a cathode lens, which can be used in multi-beam systems or multi-shaped beam systems. Embodiments and details of the invention in the application field are described in the following portion.

According to a feature of the invention, in the case of the purely electrostatic embodiment of the lens arrangement according to the invention it is provided that at least one slit diaphragm is embodied as a comb diaphragm, and the application of potentials to the segments is carried out by means of the plurality of electrostatic quadrupole lenses located adjacent to one another in the direction of the slit.

The orientation of the individual quadrupole fields is, as in the embodiments in the above descriptive part, such that the focusing takes place in the section in which the cylinder lens is not focused and the defocusing in the section in which the cylinder lens is focused. In such an arrangement, the individual quadrupoles, in interaction with the present immersion field and the cylinder lens, form in each case per se stigmatically imaging elements. For the same embodiment of the individual quadrupoles, therefore, a plurality of object regions lying separately from one another in an object plane are simultaneously imaged in corresponding regions in the image plane.

Within the scope of the invention, it is proposed to use a device of this kind as cathode lenses. In this case, the object plane of the lens arrangement according to the invention is formed by the surface of a cathode, from which electrons can be released at defined points by means of the photoemission effect. Each of the defined points is in this case assigned to a quadrupole of the slit lens.

After release of the electrons, the electrons emerging from a defined point in each case are filtered on the surface of the cathode by means of the fields of the lens arrangement and focused by means of the cylinder lens and the respective quadrupole lens. The focusing leads to a cross-over in each case in the cross-over plane, as many images of the electron sources being generated as there are defined regions available for releasing photoelectrons. The proposed arrangement can therefore be advantageously used as an electron-optical exposure device with a plurality of spaced exposure regions. Arrangements of this kind are used in multi-beam systems or multi-shaped beam systems.

In the focusing of low-energy electrons at a point, the electrons disadvantageously undergo energy broadening by virtue of the stochastic interaction of the electrons with one another. This phenomenon, known as the Boersch effect, is caused by the fact that the electrons, when passing through focusing points are subject to scattering as a result of the high current densities prevailing in this region, which leads to the aforementioned increase in energy breadth. To avoid this disadvantage, in the lens arrangement according to the invention, it is proposed to provide the respective cross-over points so as to be astigmatically adjustable. By this means, a reduction in the current density is achieved, which leads to a reduction of the scattering effect and thereby, in an advantageous manner to a reduction of the energy breadth of the imaging electrons.

Further embodiments of the invention provide additional multipole fields in the beam trajectory of the present lens arrangement. These fields serve for more effective correction of possible image aberrations of different orders. Embodiments of this kind can advantageously be used in lens arrangements used for the inspection of the surface structure of wafers, as well as those used as cathode lenses.

A preferred embodiment of the combined lens, in which further, preferably two further, slit diaphragms are designed as comb diaphragms and further, preferably two further unsegmented slit diaphragms are provided. The comb diaphragms permit according to a feature of the invention the generation of further, higher-order quadrupole fields and/or higher multipole fields, which can preferably be displaced in parallel. These additional fields are advantageously used for the correction of image aberrations that have their origin in the position of the object field deviating from the centre axis. In particular, the specification of three comb diaphragms permits the generation of fields, which lead to an astigmatic and distortion-free imaging independently of the position of the object region to be imaged.

In the variant of the lens arrangement according to the present invention with further unsegmented slit diaphragms, the diaphragms serve to limit the penetration of the quadrupole fields. Of particular importance is in particular an unsegmented diaphragm, which, looking in the direction of the beam trajectory, is arranged before the first segmented slit diaphragm. This diaphragm delimits in an advantageous manner the range of the quadrupole to the first slit diaphragm towards the object; its potential is expediently chosen so as to be equal to the average potential of the first comb diaphragm.

In an alternative to the multiplicity of above-described solutions and their further embodiments, it is provided, alternatively to a comb diaphragm in the combined lens, to connect downstream an axial, non-displaceable quadrupole lens. For the same imaging properties of this system, its advantage lies in a reduction of the technical complexity of the combined lens.

BRIEF DESCRIPTION OF THE DRAWING FIGURES

Figure 2:
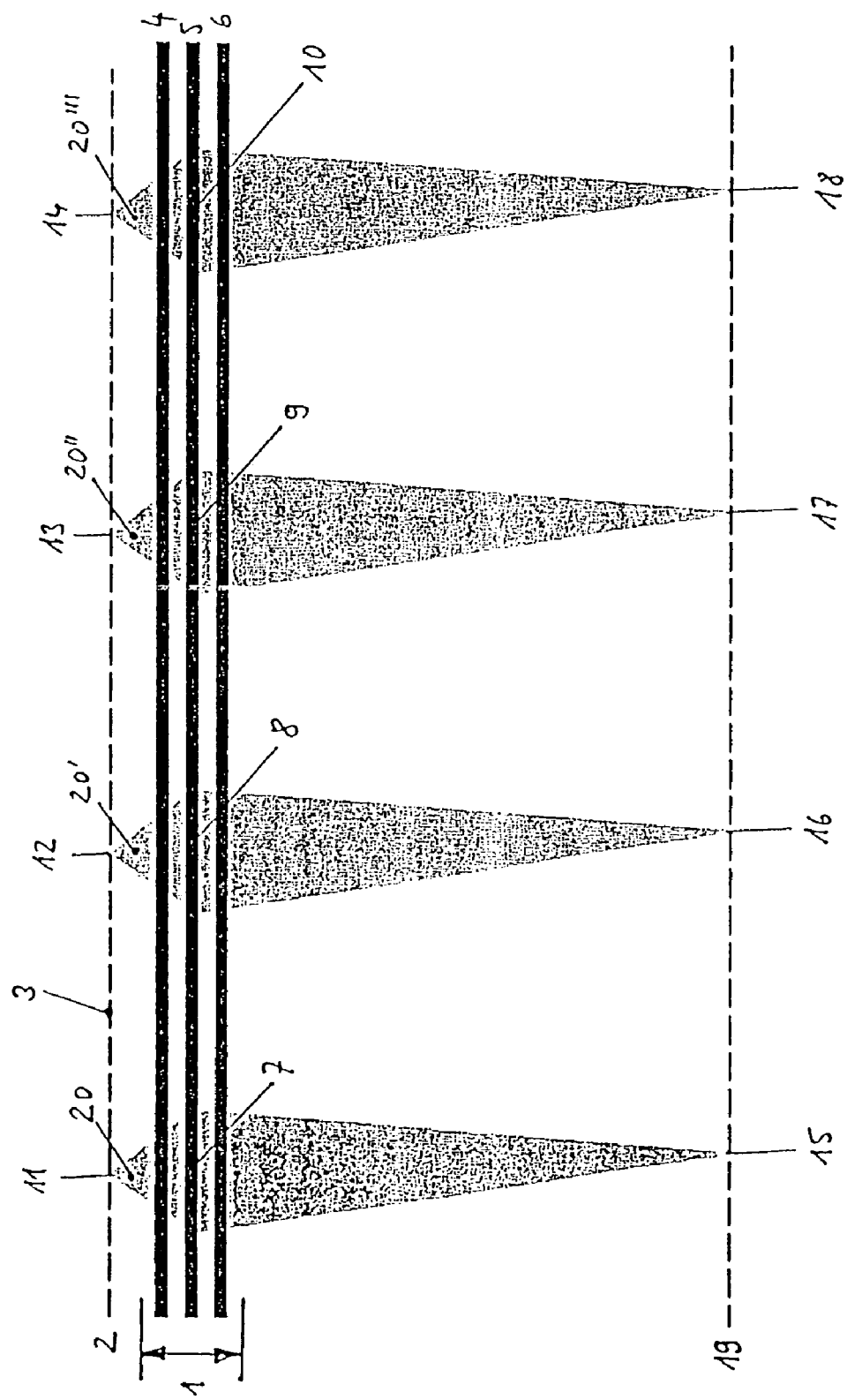

Further details, features and advantages of the invention can be taken from the following descriptive part. In this part, two exemplary embodiments of the proposed lens arrangement are explained in greater detail with reference to drawings, in which:

FIG. 1 shows a schematic diagram of an immersion objective lens with comb diaphragms FIG. 2 shows a schematic diagram of a cathode lens with comb diaphragms.

DETAILED DESCRIPTION OF THE DRAWING FIGURES

FIG. 1 shows the essential components of an objective 1 which can be operated as an immersion lens. The objective consists of a combined lens, which has the properties of a cylinder lens as well as those of a quadrupole lens. The function of the cylinder lens is obtained by the present arrangement by means of a plurality of slit diaphragms 2 to 4, whose slits are oriented perpendicular to the plane of the drawing, and to which different potentials can be applied. The function of the quadrupole lens is obtained by the present diaphragm arrangement by means of the design of at least one slit diaphragm 2 to 4 as comb diaphragm, the segmentation being made in the slit length direction, that is to say perpendicular to the plane of the drawing. In this drawing, the affected diaphragms are made up of segments insulated from one another, to which potentials can be applied, which lead to the occurrence of quadrupole fields. The potentials on the individual segments are in this case specified such that the quadrupole fields and thereby their axes, which in turn define the optical axis of the image can be displaced in the slit-length direction.

In the embodiment according to the invention, all three slit diaphragms 2 to 4 are designed as comb diaphragms; quadrupole fields can therefore in all cases be generated on each of the diaphragms. The system therefore has sufficient degrees of freedom to allow setting of an undistorted, stigmatic image independently of the position of the imaging optical axis.

In the slit centre, there is placed the optical axis 5 of the cylinder lens, which in the object plane 6 defines the position of the central object field 7. As can be derived from the figure, a further diaphragm 8 is arranged between the object plane 6 and the first slit diaphragm 2, which unlike the other slit diaphragms is not segmented. This diaphragm principally serves to limit the range of the quadrupole field generated on the first slit diaphragm towards the object 6. The potential of this diaphragm 8 is expediently chosen to be equal to the average potential of the first comb diaphragm 2.

The beam trajectory through objective 1 is illustrated by means of the fundamental paths. Reference FIGS. 9, 10 and 11, 12 indicate the fundamental paths, 9 and 10 denoting the axial paths and 11 and 12 denoting the field paths in the x and y section respectively.

FIG. 2, also in a greatly simplified form of representation, shows a lens arrangement which is used as a cathode lens 1.

The cathode 2, which is flat in design, lies in the object plane 3 of lens 1, which has slit diaphragms 4 to 6 parallel to the surface of the cathode, of which at least one is designed as a comb diaphragm. The longitudinal direction of the slits and their segmentation in the present figure extends parallel to the plane of the drawing. To the segments of the comb diaphragm(s) are applied potentials, which lead to a plurality of, in the present case four, quadrupoles located adjacent to one another. These local quadrupoles, in interaction with the immersion field (not drawn) and the cylinder lens field (not drawn), form in each case per se stigmatically imaging elements 7 to 10, which image the object regions 11 to 14 of the object plane 3, which are located separately from one another, in corresponding regions 15 to 18 in the image plane 19.

In the illustrated application of the lens as a cathode lens, in the object regions 11 to 14 of the photocathode 2, electrons 20, 20', 20", 20''' are released by means of the photoemission effect, which are filtered by the fields of the lens arrangement 1 which act on the surface of the cathode, and, by means of the cylinder lens and the respective quadrupole lens, are focused in the image plane 19 in the aforementioned points 15 to 18. The cross-over points occurring thereby serve as an electron-optical exposure device in multi-beam systems or multi-shaped beam systems.

What is claimed is:

1. A lens arrangement having a laterally displaceable optical axis for particle beams for transmitting regions of an object plane into an image plane via electrons, comprising:
   a combined lens operable as an immersion lens and including a cylinder lens and a quadrupole lens having a first slit diaphragm and a second slit diaphragm capable of being acted upon by electrical or magnetic fields, said quadrupole lens having an optical axis extending in a center plane of said cylinder lens and defining an optical axis of an image with positioning of said optical axis of said quadrupole lens being variable in a direction of a slit-shaped aperture of said cylinder lens and with focusing of said quadrupole lens taking place in a section of said cylinder lens not focused and defocusing of said quadrupole lens taking place in a section of said cylinder lens that is focused, said combined lens comprising an immersion field in an axial direction and including at least a first successive field and a second successive field, said first successive field lying between an object and said first slit diaphragm and said second successive field lying between said first slit diaphragm and said second slit diaphragm, or lying between a downstream diaphragm pair; and,
   means for adjusting said first successive field and said second successive field independently of one another with a focusing/defocusing effect of said combined lens resulting from a superimposition of said immersion field.

2. The lens arrangement having a laterally displaceable optical axis for particle beams for transmitting regions of an object plane into an image plane via electrons according to claim 1, wherein field intensity between the object and said first slit diaphragm is small as compared to field intensity of said second slit diaphragm positioned downstream.

3. The lens arrangement having a laterally displaceable optical axis for particle beams for transmitting regions of an object plane into an image plane via electrons according to claim 1, wherein said first slit diaphragm of said combined lens has a thickness that is greater than that of said second slit diaphragm positioned downstream.

4. The lens arrangement having a laterally displaceable optical axis for particle beams for transmitting regions of an object plane into an image plane via electrons according to claim 1, further comprising means for continuously changing position of said optical axis of said quadrupole lens.

5. The lens arrangement having a laterally displaceable optical axis for particle beams for transmitting regions of an object plane into an image plane via electrons according to claim 4, further comprising means for displacing the object perpendicular to said optical axis of said quadrupole lens and perpendicular to a direction of slits of said first slit diaphragm and said second slit diaphragm in said cylinder lens.

6. The lens arrangement having a laterally displaceable optical axis for particle beams for transmitting regions of an object plane into an image plane via electrons according to claim 1, wherein said cylinder lens is an electrostatic lens.

7. The lens arrangement having a laterally displaceable optical axis for particle beams for transmitting regions of an object plane into an image plane via electrons according to claim 1, wherein said quadrupole lens is a magnetic lens.

8. The lens arrangement having a laterally displaceable optical axis for particle beams for transmitting regions of an object plane into an image plane via electrons according to claim 7, wherein said magnetic lens is generated from an aperture in a material of high magnetic permeability.

9. The lens arrangement having a laterally displaceable optical axis for particle beams for transmitting regions of an object plane into an image plane via electrons according to claim 8, wherein said material of high magnetic permeability has, at its edges, conductors though which a current flows, said conductors extending parallel to said optical axis of said combined lens with a current flux in said conductors being directed parallel to opposite-lying edges of an orifice and counter to said edges extending perpendicular thereto.

10. The lens arrangement having a laterally displaceable optical axis for particle beams for transmitting regions of an object plane into an image plane via electrons according to claim 8, further comprising a magnetic dipole field superimposed on said quadrupole field.

11. The lens arrangement having a laterally displaceable optical axis for particle beams for transmitting regions of an object plane into an image plane via electrons according to claim 1, wherein said quadrupole lens is an electrostatic lens.

12. The lens arrangement having a laterally displaceable optical axis for particle beams for transmitting regions of an object plane into an image plane via electrons according to claim 11, wherein said electrostatic lens is generated by applying an electrical potential to electrically insulated segments of at least one said slit diaphragm.

13. The lens arrangement having a laterally displaceable optical axis for particle beams for transmitting regions of an object plane into an image plane via electrons according to claim 12, wherein said electrical potential on said electrically-insulated segments are time-dependent and successively migrate from one said electrically-insulated segment to another said electrically-insulated segment.

14. The lens arrangement having a laterally displaceable optical axis for particle beams for transmitting regions of an object plane into an image plane via electrons according to claim 12, further comprising a plurality of electrostatic lens lying side-by-side and generated by applying electrical potentials to said electrically-insulated segments thereof.

15. The lens arrangement having a laterally displaceable optical axis for particle beams for transmitting regions of an object plane into an image plane via electrons according to claim 14, further comprising means for astigmatically adjusting said cross-over plane.

16. The lens arrangement having a laterally displaceable optical axis for particle beams for transmitting regions of an object plane into an image plane via electrons according to claim 12, wherein the object plane is a surface of a cathode with electrons releasable from said surface of said cathode at defined points via a photoemission effect, and with one said quadrupole lens being assigned to said defined points.

17. The lens arrangement having a laterally displaceable optical axis for particle beams for transmitting regions of an object plane into an image plane via electrons according to claim 12, wherein said electrons released at said defined points via said assigned said quadrupole lenses in an interaction with said cylinder lens and said immersion lens are able to be focused in a cross-over plane.

18. The lens arrangement having a laterally displaceable optical axis for particle beams for transmitting regions of an object plane into an image plane via electrons according to claim 1, further comprising a third slit diaphragm and a fourth slit diaphragm included as comb diaphragms on which quadrupole fields are able to be generated, said combined lens further including two unsegmented slit diaphragms.

19. The lens arrangement having a laterally displaceable optical axis for particle beams for transmitting regions of an object plane into an image plane via electrons according to claim 1, further comprising an axial, non-displaceable quadrupole lens connected downstream and outside of said combined lens.

20. A method for inspecting a surface structure of semiconductor wafers in a lithographic procedure for producing the semiconductor wafers, comprising the step of:

inspecting a surface structure of a semiconductor wafer utilizing a lens arrangement having a laterally displaceable optical axis for particle beams for transmitting regions of an object plane into an image plane via electrons, including:

a combined lens operable as an immersion lens and including a cylinder lens and a quadrupole lens having a first slit diaphragm and a second slit diaphragm capable or being acted upon by electrical or magnetic fields, said quadrupole lens having an optical axis extending in a center plane of said cylinder lens and defining an optical axis of an image with positioning of said optical axis of said quadrupole lens being variable in a direction of a slit-shaped aperture of said cylinder lens and with focusing of said quadrupole lens taking place in a section of said cylinder lens not focused and defocusing of said quadrupole lens taking place in a section of said cylinder lens that is focused, said combined lens comprising an immersion field in an axial direction and including at least a first successive field and a second successive field, said first successive field lying between an object and said first slit diaphragm and said second successive field lying between said first slit diaphragm and said second slit diaphragm, or lying between a downstream diaphragm pair; and, means for adjusting said first successive field and said second successive field independently of one another with a focusing/defocusing effect of said combined lens resulting from a superimposition of said immersion field.

* * * * *